US011953823B2

(12) United States Patent
Spence

(10) Patent No.: US 11,953,823 B2
(45) Date of Patent: Apr. 9, 2024

(54) MEASUREMENT METHOD AND APPARATUS

(71) Applicant: ASML NETHERLANDS B.V., Veldhoven (NL)

(72) Inventor: Christopher Alan Spence, Los Altos, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 524 days.

(21) Appl. No.: 17/266,741

(22) PCT Filed: Aug. 12, 2019

(86) PCT No.: PCT/EP2019/071615
§ 371 (c)(1),
(2) Date: Feb. 8, 2021

(87) PCT Pub. No.: WO2020/043474
PCT Pub. Date: Mar. 5, 2020

(65) Prior Publication Data
US 2021/0311384 A1    Oct. 7, 2021

Related U.S. Application Data

(60) Provisional application No. 62/725,631, filed on Aug. 31, 2018.

(51) Int. Cl.
*G03F 1/36* (2012.01)
*G03F 7/00* (2006.01)
(52) U.S. Cl.
CPC ............ *G03F 1/36* (2013.01); *G03F 7/70441* (2013.01); *G03F 7/705* (2013.01)
(58) Field of Classification Search
CPC ......... G03F 1/36; G03F 7/70441; G03F 7/705
USPC ....................................... 430/5, 30
See application file for complete search history.

(56) References Cited

U.S. PATENT DOCUMENTS

| 7,587,704 | B2 | 9/2009 | Ye et al. |
| 8,938,695 | B1 | 1/2015 | Juang et al. |
| 10,795,266 | B2 | 10/2020 | Ye et al. |
| 2002/0071997 | A1 | 6/2002 | Ahrens et al. |
| 2006/0288318 | A1 | 12/2006 | Wright et al. |
| 2008/0003510 | A1 | 1/2008 | Harazaki |
| 2009/0157360 | A1 | 6/2009 | Ye et al. |
| 2010/0162197 | A1 | 6/2010 | Ye et al. |
| 2011/0202893 | A1 | 8/2011 | Kusnadi et al. |

FOREIGN PATENT DOCUMENTS

| CN | 102063022 | 5/2011 |
| CN | 102955363 | 3/2013 |
| CN | 104347361 | 2/2015 |
| CN | 106873315 | 6/2017 |
| JP | 2009115844 | 5/2009 |
| JP | 2012150214 | 8/2012 |
| KR | 20090071735 | 7/2009 |
| KR | 20100128825 | 12/2010 |
| TW | 201823853 | 7/2018 |
| WO | 2016096308 | 6/2016 |
| WO | 2017171890 | 10/2017 |
| WO | 2017178276 | 10/2017 |
| WO | 2018121965 | 7/2018 |
| WO | 2018125219 | 7/2018 |

OTHER PUBLICATIONS

International Search Report and Written Opinion issued in corresponding PCT Patent Application No. PCT/EP2019/071615, dated Oct. 14, 2019.
Taiwanese Office Action issued in corresponding Taiwanese Patent Application No. 108130779, dated Jun. 16, 2020.
Office Action issued in corresponding Chinese Patent Application No. 201980055729.X, dated Dec. 30, 2023.

*Primary Examiner* — Christopher G Young
(74) *Attorney, Agent, or Firm* — Pillsbury Winthrop Shaw Pittman LLP

(57) ABSTRACT

A method of controlling an imaging process uses a qualified optical proximity correction (OPC) model, the process including obtaining an OPC model that is configured to model the behavior of OPC modifications to a pre-OPC design in a process for forming a pattern on a substrate using a post-OPC design in a patterning process, using the patterning process in a manufacturing environment, collecting process control data in substrates patterned using the patterning process in the manufacturing environment, storing the collected process control data in a database, analyzing, by a hardware computer system, the stored, collected process control data to verify that the OPC model is correcting pattern features within a selected threshold, and for pattern features falling outside the selected threshold, determining a modification to the imaging process to correct imaging errors.

20 Claims, 7 Drawing Sheets

MEASUREMENT METHOD AND APPARATUS

CROSS-REFERENCE TO RELATED APPLICATIONS

This application is the U.S. national phase entry of PCT Patent Application No. PCT/EP2019/071615, which was filed on Aug. 12, 2019, which is based upon and claims the benefit of priority of U.S. patent application Ser. No. 62/725,631, which was filed on Aug. 31, 2018, each of which is incorporated herein in its entirety by reference.

FIELD

The present description relates to methods of, and apparatuses for, measurement.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc. and similarly can be characterized in terms of, e.g., overlay errors, CD errors, etc. The errors may directly cause a problem in terms of the function of the device, including failure of the device to function or one or more electrical problems of the functioning device.

As noted above, in patterning processes, it is desirable to frequently make measurements of the structures created, e.g., for process control and verification. One or more parameters of the structures are typically measured or determined, for example the critical dimension of a structure, the overlay error between successive layers formed in or on the substrate, etc. There are various techniques for making measurements of the microscopic structures formed in a patterning process. Various tools for making such measurements are known including, but not limited to, scanning electron microscopes (SEMs), which are often used to measure critical dimension (CD). SEMs have high resolving power and are capable of resolving features of the order of 30 nm or less, 20 nm or less, 10 nm or less, or 5 nm or less. SEM images of semiconductor devices are often used in the semiconductor fab to observe what is happening at the device level.

The measurement information (such as extracted from SEM images of device structures) can be used for process modeling, existing model calibration (including recalibration), defect detection, estimation, characterization or classification, yield estimation, process control or monitoring, etc.

A method of controlling an imaging process uses a qualified optical proximity correction (OPC) model, including obtaining an OPC model that is configured to model the behavior of OPC modifications to a pre-OPC design in a process for forming a pattern on a substrate using a post-OPC design in a patterning process, using the patterning process in a manufacturing environment, collecting process control data in substrates patterned using the patterning process in the manufacturing environment, storing the collected process control data in a database, analyzing, by a hardware computer system, the stored, collected process control data to verify that the OPC model is correcting pattern features within a selected threshold, and for pattern features falling outside the selected threshold, determining a modification to the imaging process to correct imaging errors.

In an aspect, there is provided a method of manufacturing devices wherein a device pattern is applied to a series of substrates using a patterning process, the method including evaluating a patterned structure formed using the patterning process using a method described herein and controlling the patterning process for one or more of the substrates in accordance with the result of the method. In an embodiment, the patterned structure is formed on at least one of the substrates and the method comprises controlling the patterning process for later substrates in accordance with the result of the method.

In aspect, there is provided a non-transitory computer program product comprising machine-readable instructions configured to cause a processor to cause performance of a method described herein.

In an aspect, there is provided an inspection system. The system includes an inspection apparatus as described herein; and an analysis engine comprising a non-transitory computer program product as described herein. In an embodiment, the inspection apparatus comprises an electron beam inspection apparatus. In an embodiment, the system further comprises a lithographic apparatus comprising a support structure configured to hold a patterning device to modulate a radiation beam and a projection optical system arranged to project the modulated radiation beam onto a radiation-sensitive substrate.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
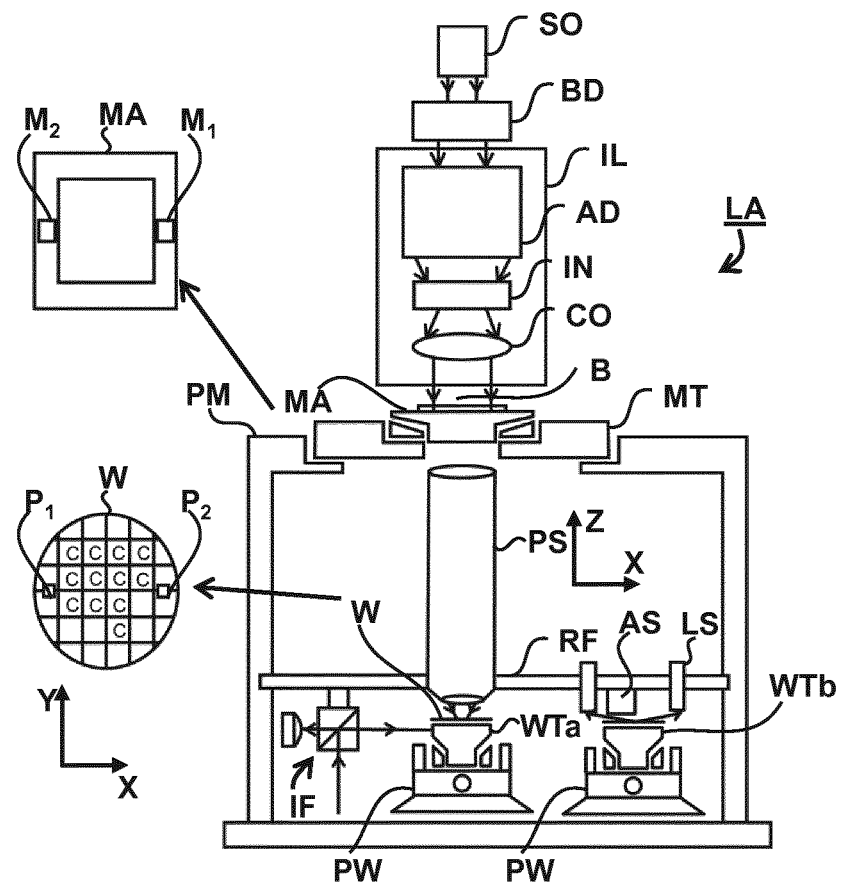
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different patterning or other process conditions than adjacent features. An embodiment of an alignment system, which detects the alignment markers, is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
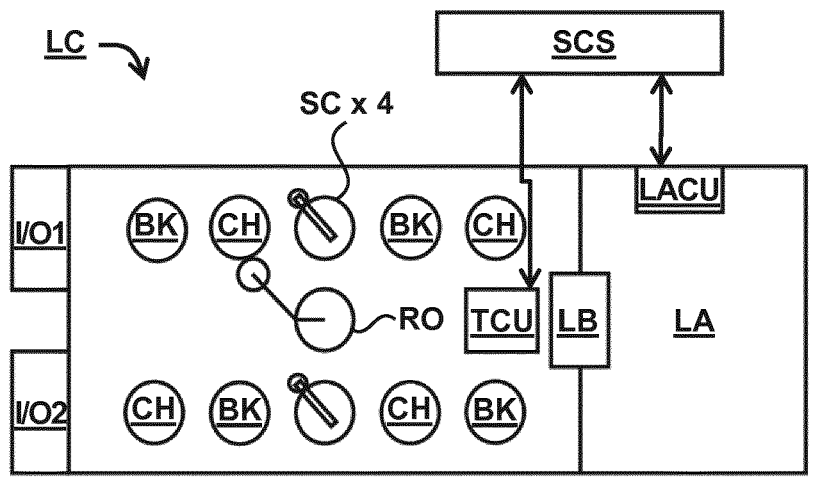
FIG. 2 schematically depicts an embodiment of a lithographic cell or cluster.

As shown in FIG. 2, a lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop patterned resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

To enable that the substrate that is processed (e.g., exposed) by the patterning process is processed correctly and consistently, it is desirable to inspect a processed substrate to measure one or more properties such as overlay error between subsequent layers, line thickness, critical dimension (CD), etc. If an error is detected, an adjustment may be made to the patterning process, e.g., in terms of changing a design of, or changing a tool for designing, the patterning process, controlling an executing patterning process, etc.

An inspection apparatus can be used for such measurement. An inspection apparatus is used to determine one or more properties of a substrate, and in particular, how one or more properties of different substrates or different layers of the same substrate vary from layer to layer and/or across a substrate and/or across different substrates, e.g., from substrate to substrate. The inspection apparatus may be integrated into the lithographic apparatus LA or the lithocell LC or may be a stand-alone device.

An inspection apparatus to determine one or more properties of a substrate can take various different forms. For example, the inspection apparatus may use photon electromagnetic radiation to illuminate the substrate and detect radiation redirected by the substrate; such inspection apparatuses may be referred to as bright-field inspection apparatuses. A bright-field inspection apparatus may use radiation with a wavelength in, for example, the range of 150-900 nm. The inspection apparatus may be image-based, i.e., taking an image of the substrate, and/or diffraction-based, i.e., measuring intensity of diffracted radiation. The inspection apparatus may inspect product features (e.g., features of an integrated circuit to be formed using the substrate or features of a mask) and/or inspect specific measurement targets (e.g., overlay targets, focus/dose targets, CD gauge patterns, etc.).

Inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

Figure 3:
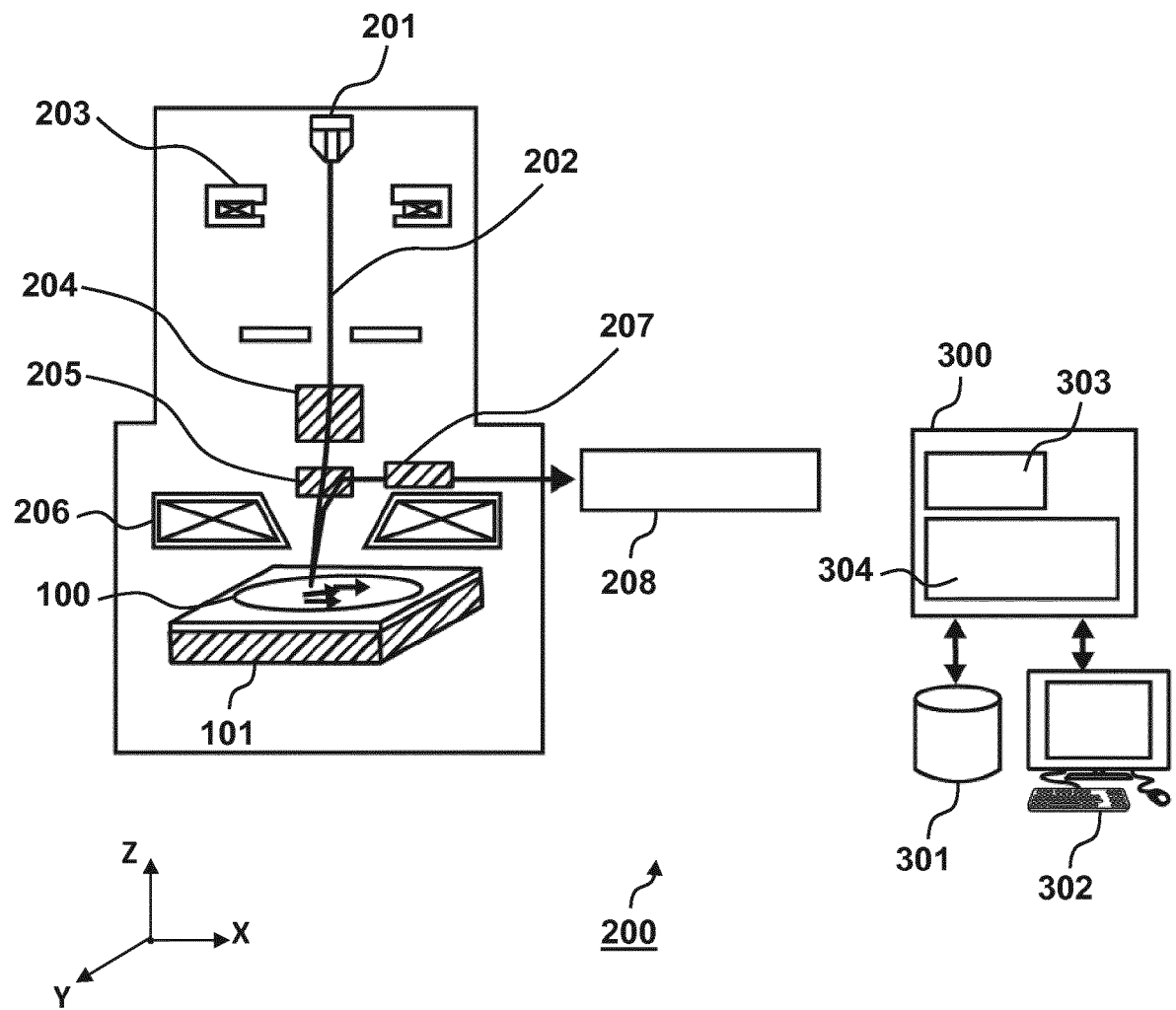
FIG. 3 schematically depicts an embodiment of a scanning electron microscope (SEM)

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate. FIG. 3 schematically depicts an embodiment of an electron beam inspection apparatus 200. A primary electron beam 202 emitted from an electron source 201 is converged by condenser lens 203 and then passes through a beam deflector 204, an E x B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E x B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 4:
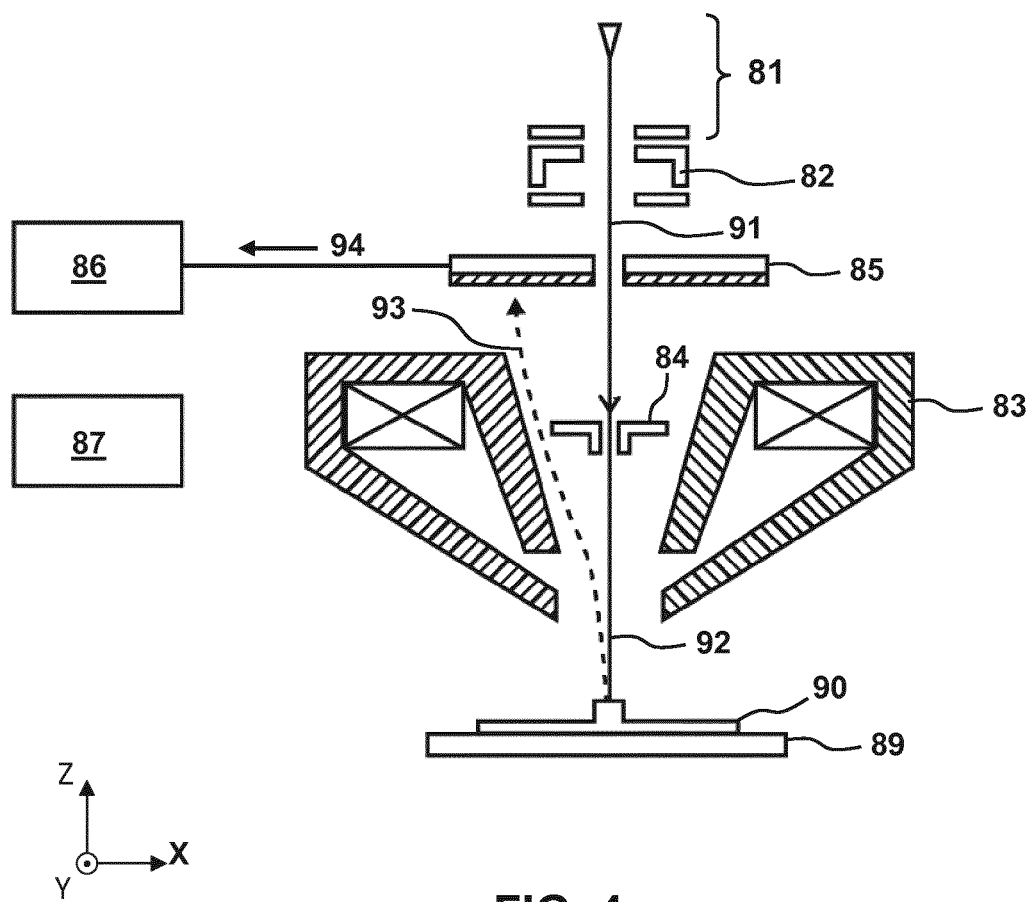
FIG. 4 schematically depicts an embodiment of an electron beam inspection apparatus.

FIG. 4 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 3 that uses a probe to inspect a substrate, the electron current in the system of FIG. 4 is significantly larger compared to, e.g., a CD SEM such as depicted in FIG. 3, such that the probe spot is large enough so that the inspection speed can be fast. However, the resolution may not be as high as compared to a CD SEM because of the large probe spot.

The SEM images, from, e.g., the system of FIG. 3 and/or FIG. 4, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Now, besides measuring substrates in a patterning process, it is often desirable to use one or more tools to produce results that, for example, can be used to design, control, monitor, etc. the patterning process. To do this, there may be provided one or more tools used in computationally controlling, designing, etc. one or more aspects of the patterning process, such as the pattern design for a patterning device (including, for example, adding sub-resolution assist features or optical proximity corrections), the illumination for the patterning device, etc. Accordingly, in a system for computationally controlling, designing, etc. a manufacturing process involving patterning, the major manufacturing system components and/or processes can be described by various functional modules. In particular, in an embodiment, one or more mathematical models can be provided that describe one or more steps and/or apparatuses of the patterning process, including typically the pattern transfer step. In an embodiment, a simulation of the patterning process can be performed using one or more mathematical models to simulate how the patterning process forms a patterned substrate using a measured or design pattern provided by a patterning device.

Figure 5:
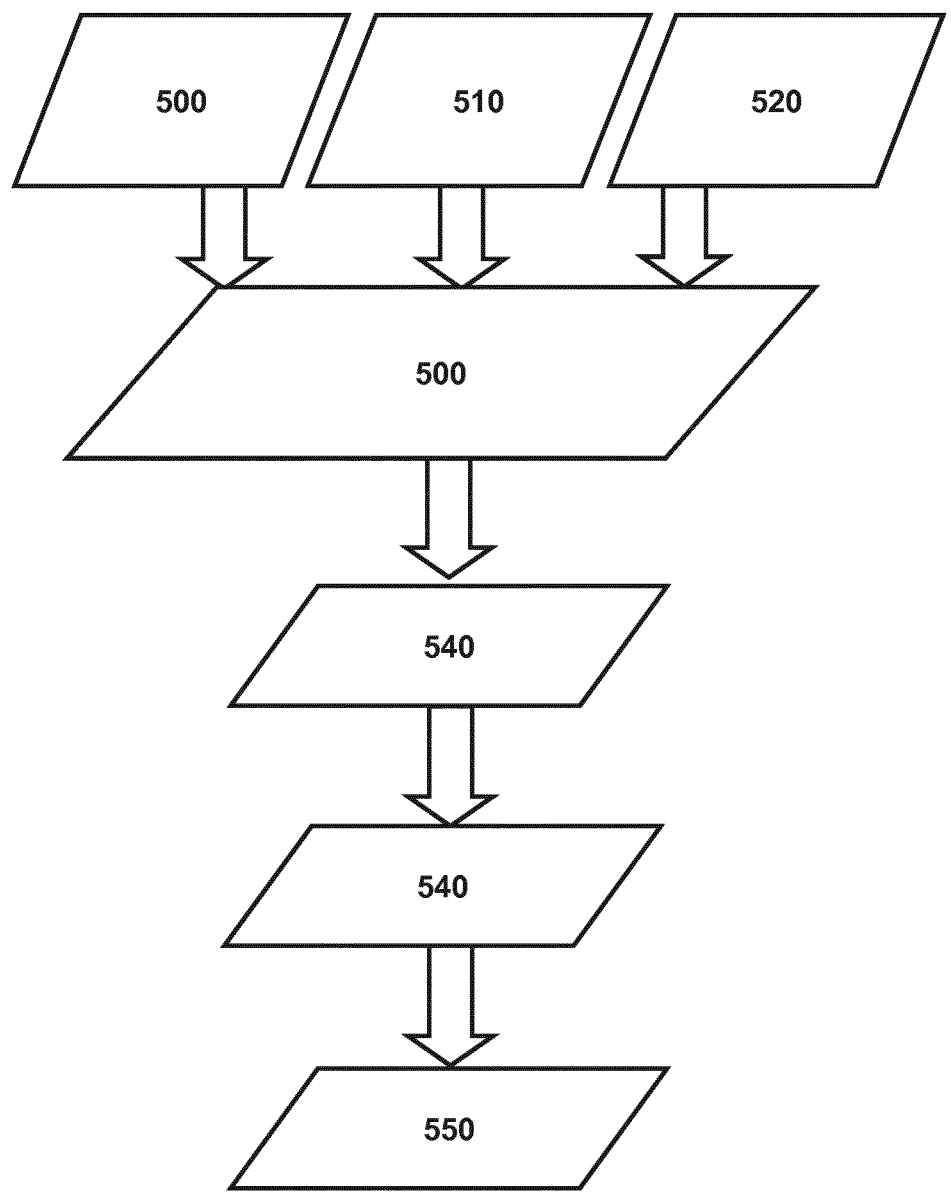
FIG. 5 depicts an example flow chart for modeling and/or simulating at least part of a patterning process.

An exemplary flow chart for modeling and/or simulating parts of a patterning process (e.g., lithography in a lithographic apparatus) is illustrated in FIG. 5. As will be appreciated, the models may represent a different patterning process and need not comprise all the models described below. A source model 500 represents optical characteristics (including radiation intensity distribution, bandwidth and/or phase distribution) of the illumination of a patterning device. The source model 500 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 510 represents optical characteristics (including changes to the radiation intensity distribution and/or the phase distribution caused by the projection optics) of the projection optics. The projection optics model 510 can represent the optical characteristics of the projection optics, including aberration, distortion, one or more refractive indexes, one or more physical sizes, one or more physical dimensions, etc.

The patterning device model module 120 captures how the design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the device design. The device design is generally defined as the pre-OPC patterning device layout, and will be provided in a standardized digital file format such as GDSII or OASIS.

A design layout model 520 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. The design layout model 520 can represent one or more physical properties of a physical patterning device, as described, for example, in U.S. Pat. No. 7,587,704, which is incorporated by reference in its entirety. Since the patterning device used in the lithographic projection apparatus can be changed, it is desirable to separate the optical properties of the patterning device from the optical properties of the rest of the lithographic projection apparatus including at least the illumination and the projection optics.

An aerial image 530 can be simulated from the source model 500, the projection optics model 510 and the design layout model 520. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 550 can be simulated from the aerial image 530 using a resist model 540. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 510.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 150. The post-pattern transfer process model 150 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

An application of the one or more models described herein in sophisticated fine-tuning steps of the patterning process, such as fine-tuning steps applied to the illumination, projection system and/or patterning device design. These include, for example, but not limited to, optimization of numerical aperture, optimization of coherence settings, customized illumination schemes, use of phase shifting features in or on a patterning device, optical proximity correction in the patterning device layout, placement of sub-resolution assist features in the patterning device layout or other methods generally defined as "resolution enhancement techniques" (RET).

As an example, optical proximity correction (OPC) addresses the fact that the final size and placement of a printed feature on the substrate will not simply be a function of the size and placement of the corresponding feature on the patterning device. For the small feature sizes and high feature densities present on typical electronic device designs, the position of a particular edge of a given feature will be influenced to a certain extent by the presence or absence of other adjacent features. In an embodiment, these proximity effects arise from coupling of radiation from more than one feature. In an embodiment, proximity effects arise from diffusion and other chemical effects during post-exposure bake (PEB), resist development, and etching that generally follow lithographic exposure.

In order to help ensure that the features are generated on a substrate in accordance with the requirements of the given device design, proximity effects should be predicted utilizing sophisticated numerical models, and corrections or pre-distortions are applied to the design of the patterning device before successful manufacturing of devices becomes possible. These modifications may include shifting or biasing of edge positions or line widths and/or application of one or more assist features that are not intended to print themselves, but will affect the properties of an associated primary feature. These modifications to the pre-OPC design may be referred to generally as OPC features or OPC modifications.

The application of a model-based patterning process design requires good process models and considerable computational resources, given the many millions of features typically present in a chip design. However, applying model-based design is generally not an exact science, but an iterative process that does not always resolve all possible weaknesses of a device design. Therefore, post-OPC designs, i.e. patterning device layouts after application of all pattern modifications by OPC and any other RET's, should be verified by design inspection, e.g., intensive full-chip simulation using calibrated numerical process models, in order to reduce the possibility of design flaws being built into the manufacturing of a patterning device.

However, sometimes the model parameters may be inaccurate from, e.g., measurement and reading errors, and/or there may be other imperfections in the system. With precise calibration of the model parameters, extremely accurate simulations can be done. So, since computational patterning process evaluation should involve robust models that describe the patterning process precisely, a calibration procedure for such models should be used to achieve models that are valid, robust and accurate across the applicable process window.

To enable calibration of the computational models (and optionally in order that the substrate that is exposed by the lithographic apparatus is exposed correctly and consistently), it is desirable to take various measurements of patterns printed on a substrate using an inspection apparatus. In some embodiments, the inspection apparatus may be a scanning electron microscope (SEM) that yields an image of one or more structures (e.g., one or more test (or calibration) patterns or one or more patterns corresponding to some or all the structures of a device) exposed or transferred on the substrate.

So, in an embodiment, calibration is done by printing a certain number of 1-dimensional and/or 2-dimensional gauge patterns on a substrate (e.g., the gauge patterns may be specially designated measurement patterns or may be device parts of a design device pattern as printed on the substrate) and performing measurements on the printed patterns. More specifically, those 1-dimensional gauge patterns are line-space patterns with varying pitch and CD, and the 2-dimensional gauge patterns typically include line-ends, contacts, and/or SRAM (Static Random Access Memory) patterns. These patterns are then imaged onto a substrate and resulting substrate CDs or contact hole (also known as a via or through-chip via) energy are measured. The original gauge patterns and their substrate measurements are then used jointly to determine the model parameters which reduce or minimize the difference between model predictions and substrate measurements. In an embodiment, the one or more gauge or calibration patterns may not correspond to structures in a device. But, the one or more gauge or calibration patterns possess enough similarities with one or more patterns in the device to allow accurate prediction of the one or more device patterns.

Figure 6:
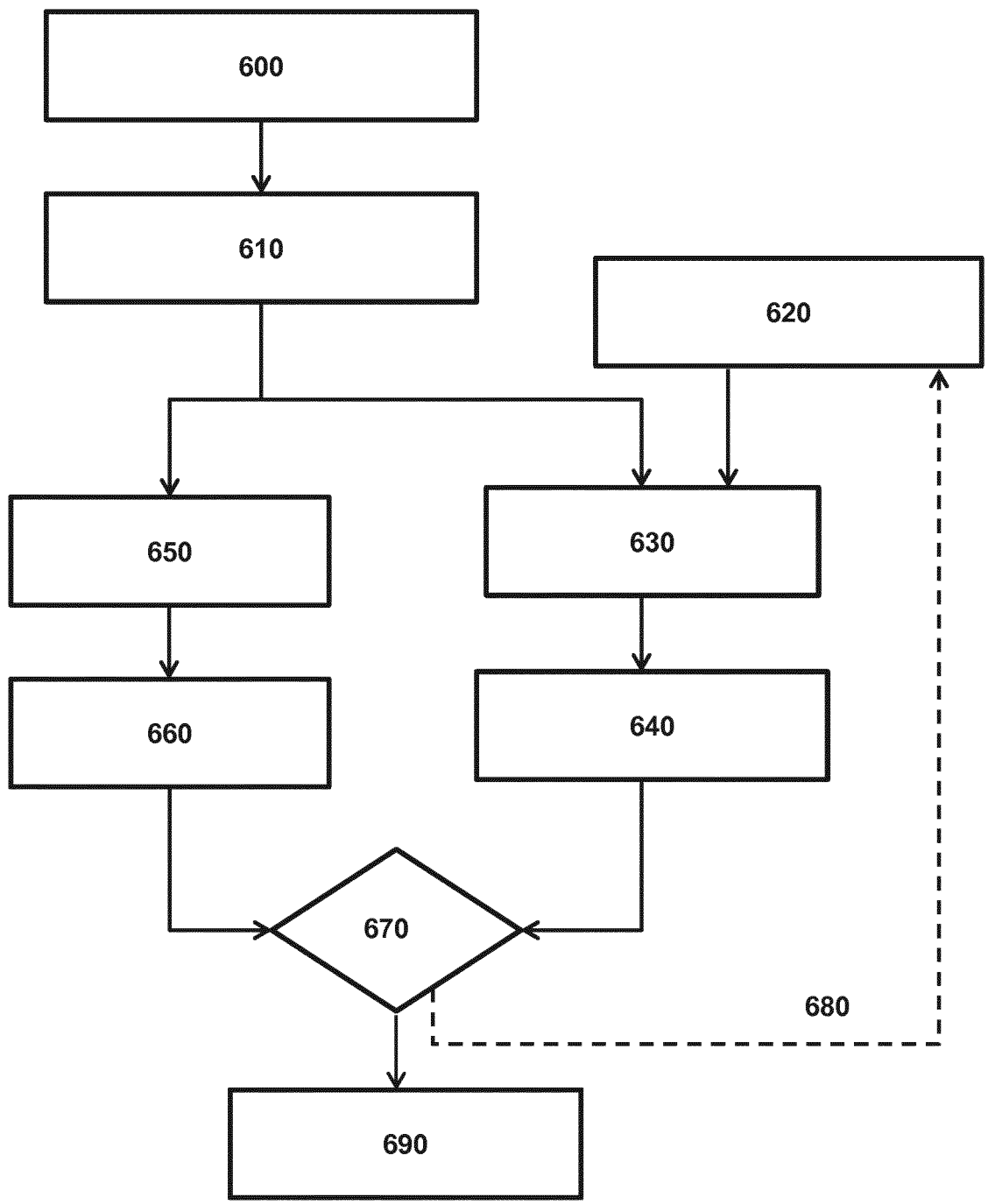
FIG. 6 depicts an example flow chart for model calibration.

An example model calibration process as described above is illustrated in FIG. 6. The process begins with a design layout 600, which can include gauge and optionally other test patterns, which can be in a standard format such as GDSII or OASIS. Next, the design layout is used to generate a patterning device layout at 610, which can be in a standard format such as GDSII or OASIS and which may include OPC or other RET features. Then, in an embodiment, two separate paths are taken, for simulation and measurement.

In a simulation path, the patterning device layout and a model 620 are used to create a simulated resist image in step 630. The model 620 provides a model of the patterning process for use in computational lithography, and the calibration process aims to make the model 620 as accurate as possible, so that computational lithography results are likewise accurate. The simulated resist image is then used to determine predicted critical dimensions (CDs), etc. in step 640.

In a measurement path, the patterning device layout 610 is used with or to form a physical mask (e.g., a reticle), which is then imaged onto a substrate at 650. The patterning process (e.g. NA, focus, dose, illumination source, etc. for optical lithography) used to pattern the substrate is the same as that intended to be captured in model 620. Measurements (e.g. using a metrology tool (such as a SEM, etc.) are then performed on the actual patterned substrate at 660, which yields measured CDs, contours, etc.

A comparison is made at 670 between the measurements from 660 and the predictions from 640. If the comparison determines that the predictions match the measurements within a predetermined error threshold, the model is considered to be successfully calibrated at 690.

Otherwise, changes are made to the model 620, and steps 630, 640 and 670 are repeated until the predictions generated using the model 620 match the measurements within a predetermined threshold. In an embodiment, the model comprises an OPC model. While the description hereafter will focus on an OPC model as an embodiment, the model may be other than or in addition to an OPC model.

As noted above, values of a geometric parameter (such as CD) are extracted from an image (e.g., an image generated using an electron beam such as a SEM image) of a formed pattern on a substrate for, e.g. model calibration or for other purposes. For example, as noted above for model calibration, a gauge pattern can be used.

Figure 7:
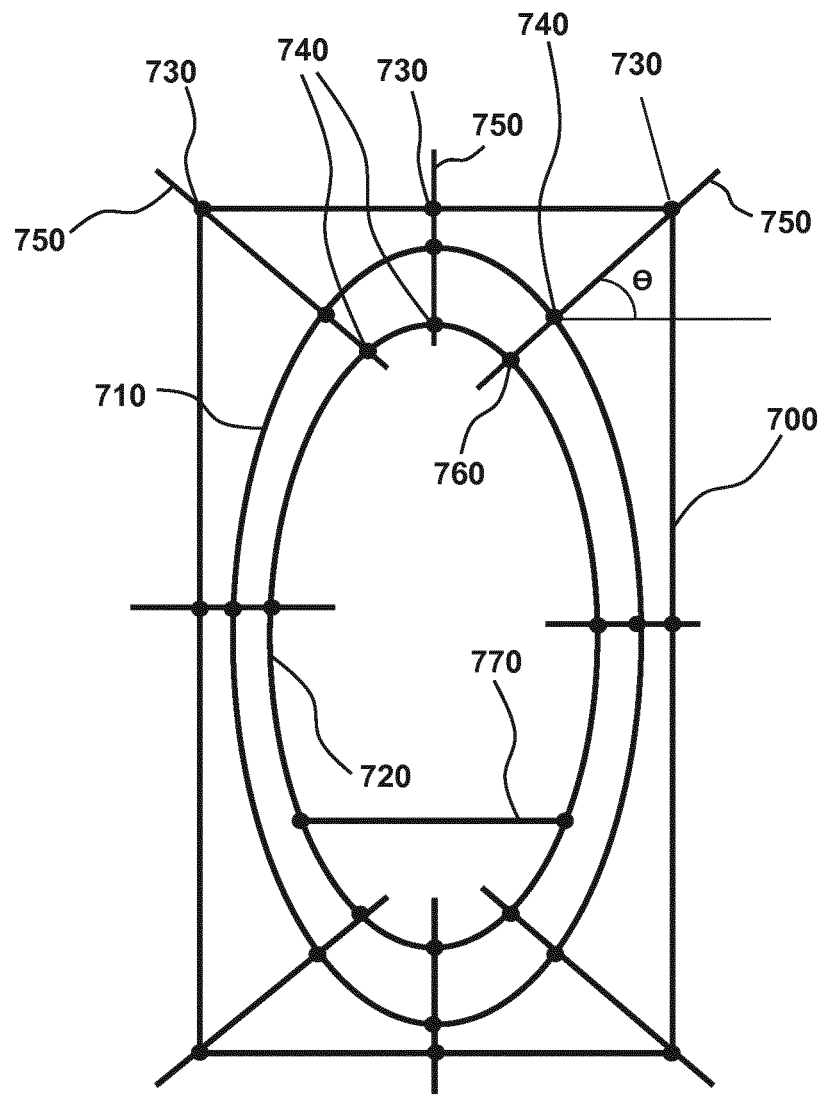
FIG. 7 schematically depicts an embodiment of a pattern analyzed according to an embodiment of a method.
Figure 8:
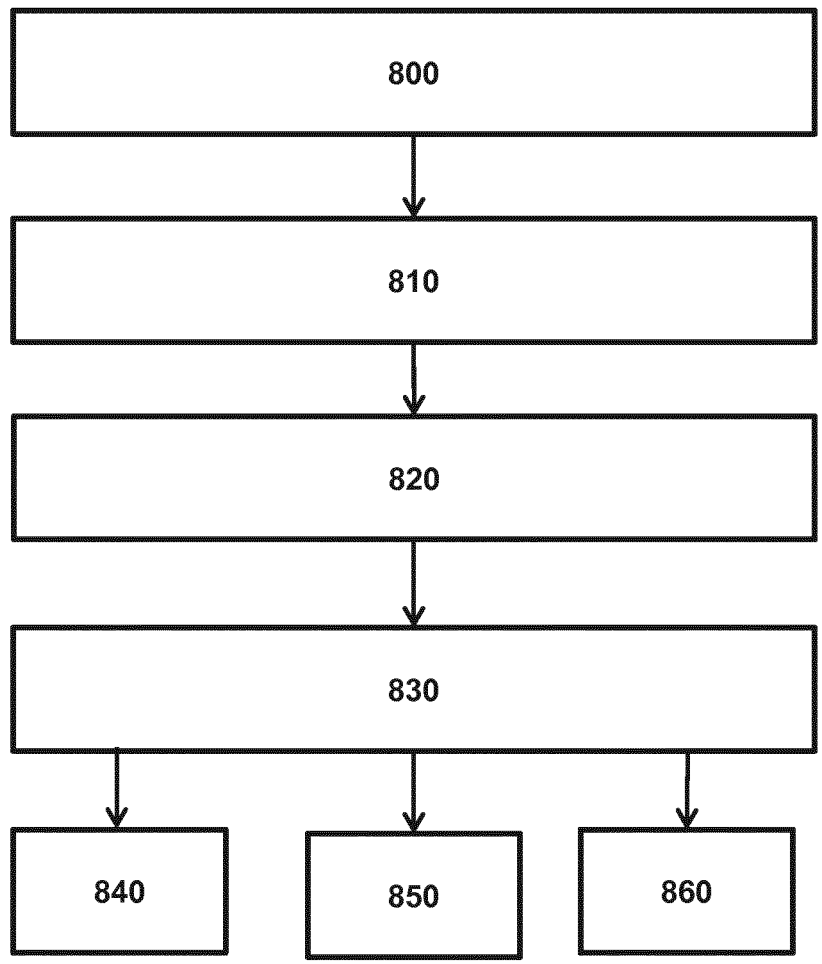
FIG. 8 depicts an example flow chart for a method of controlling an imaging process in accordance with an embodiment.

Referring to FIG. 7, a schematic of a pattern (e.g., a gauge pattern) in various forms is depicted. FIG. 7 illustrates an image of a generally elliptical pattern 720 that is produced on a substrate from, e.g., a nominally rectangular design layout 700 (e.g., as designed to be produced at the substrate). While the boundary of the generally elliptical pattern 720 is depicted as a contour, it need not be a contour but rather the boundary can be the pixel data that represents the edge of the pattern 720 (that is a contour has not been extracted). Further, the pattern in FIG. 7 is an elliptical shape that protrudes from the substrate wherein the interior of the pattern 720 is higher than points immediately outside the boundary. However, the pattern 720 need not be a protrusion but could be a trench type structure; in which case, the interior of the pattern 720 is below the region immediately exterior of the boundary of pattern 720. If pattern 720 were a trench, the nominally rectangular design layout 700 may be smaller and generally in the interior of the pattern 720.

In an image of the pattern, gauges are specified and evaluated. In an embodiment, the gauges are the evaluation locations on the pattern to determine values of a geometric parameter such as CD, edge position, etc. The values of the gauges can be used for various purposes in design, control, etc. of a patterning process, an apparatus of the patterning process or a tool used with design, control, etc. of a patterning process. In one particular example, the values of gauges are used for calibration of, for example, an OPC model. So, in that case, the calibration of an OPC model is effectively aiming to create a model that minimizes an error associated with the gauges. While an embodiment of the determination of gauge values for model calibration is described here specifically, it will be appreciated that the determination of gauge values can be used for various purposes.

In FIG. 7, an example gauge is illustrated as imaginary line 770 that is superimposed on the boundary (e.g., contour) of a shape of the pattern that is measured, i.e., the gauge 770 for CD in the X direction. As will be appreciated, numerous other gauges can be specified (e.g., more gauges in the X direction and gauges in the Y direction). Gauge 770 is sometimes referred to as a cutline and so facilitates the measurement distance of a selected "cut" on the pattern. The cutline is typically aligned in the X and/or Y direction and in some cases a certain angle. Another example gauge is an evaluation point (EP) 760. An EP 760 does not necessarily require another corresponding point on a line like a cutline. A gauge 770 or an EP 760 is normally collected from a substrate pattern contour (i.e., the pattern image is processed to create a contour and then the edge position at the EP is extracted from the contour at the desired EP).

The gauges are positioned at specific spots in a pattern layout and essentially represent the points at the boundary of the pattern. Desirably, a number of gauges are selected to be representative of the shape of the pattern but the number of gauges are limited by, e.g., throughput concerns and diminishing returns (e.g., while more gauges will provide greater accuracy, it may not provide much more). Indeed, thousands of different measurements and/or shapes are made for any given OPC model, so there is a variety of shapes present on any substrate that are measured and all of them should be measured well if they are to report values that correspond to what the actual OPC model would like to have as far as information corresponding to the gauge positions.

In typical approaches, once the OPC model is generated, it will be fixed going forward as a result of the large numbers of measurements as described above. As will be appreciated, if the model contains errors, then the final OPCs applied to the mask design will likewise contain errors. Modern layouts tend to have large model error as a result of complex layouts. Likewise, the errors in the mask will be replicated on all of the wafers produced using that mask. That is, any error in the OPC model becomes a permanent part of the design and a systematic error in the manufacturing process. Even if an updated mask is designed based on information derived from product metrology, the original OPC model is generally going to be used to implement the changes to the design, replicating any errors in that model.

Once built, the model is qualified on an actual wafer to ensure that chip yield is acceptable. Thus, a qualified and calibrated model is both difficult to update and requires exceptionally tight specifications to ensure sufficient quality. This may be defined, for example, in terms of errors occurring in the 3σ frequency range. In the modern production environment, with patterns that are significantly more complex, 6 or even 7σ accuracy may become a minimum requirement.

Because the final products may be so sensitive to model errors, even when optimized for such extreme events, slight changes to the pattern to be imaged can reveal errors in the OPC model that are not evident initially. Typically, however, the OPC model will not be monitored going forward such that if it were to drift out of specifications in high volume manufacturing, it would not be detected.

Furthermore, the OPC model may be applied to different patterns, different manufacturing tracks, different process variables, and other possible changes in aspects of production. Any small model error may become more relevant then it initially appeared to be when masks produced using the model are used under these differing conditions.

Retargeting is a process by which OPC features are generated and adjusted for a mask design with the goal of improving the process window performance. In one example, rules-based retargeting can be applied to a specific type of feature in an automated manner using software tools. In a basic example, isolated lines tend to be more difficult to produce properly than are dense lines (i.e., they have less process window leeway). Thus, a rule could be implemented that makes isolated lines larger, taking advantage of the general rule that process window margin is greater for larger features. The rules applied and/or assist features generated in the retargeting process will depend in large part on the OPC model, and thus defects in the model tend to result in performance issues with the retargeting process.

Thus, the inventor has developed a process in which errors in an OPC model can be monitored and corrected or accounted for over time. Once measured, analyzed, and understood, various processes may be changed to compensate for the known OPC model errors. Further, the process in accordance with an embodiment can provide a monitoring and retargeting to allow selectively updating retargeting flows to correct and validate out of specification locations to attempt to keep all geometries within specifications (that is, any measured errors are within a selected threshold) or alternately, a rebuilding of the OPC model.

As a result, the retargeting approach may be adaptively updated based on information collected over time, rather than relying strictly on a one-time qualified model.

In an embodiment, a database is used to collect and store 800 process control data from various aspects of the manufacturing process. For example, a database module of a process control system can be used to collect the performance-related data, including process monitoring and control data. One such database could include, for example, the virtual control platform (VCP) from ASML.

The database may be included in a computer system separate from the litho cell in a data center on site or even remote from the lithographic production line. It may include, for example, a hardware cluster for storing and analyzing both data relating to the OPC model and other production models, processes, and data. Other models may include the etch model and the resist model, for example.

Data collected may include, for example, CD control data, OPC calibration data, OPC monitoring and hotspot CD data, defect data, data from scanners or other tools (such as etch and deposition tools) used in the patterning process such as settings, internal sensors, and self-monitoring data, and process metrology data including, for example, SEM or other imaging of product wafers. In principal, any data representing the output of the manufacturing process may form an input into the method. In order to track performance of particular production lines or tracks, particular process tools such as lithography tools or etch tools, for example, and particular processes, data including identifying information for the specific systems employed in the production process may be collected.

The collected data may then be analyzed and compared 810 to the process of record (POR) model information so that various possible flaws in the model may be identified. In this manner, the models may be re-verified and/or incrementally modified using best known method flows. The process of analysis and comparison and verification of the models may be performed iteratively over time.

In re-verifying, the collected data are compared to expected or predicted values for the data given the known process of record and the existing models. Where there is a difference between the collected data and the predictions, the model can be considered to be out of specification. This re-verification may be performed, for example, daily, though in principle it may be performed more or less frequently. In an embodiment, it is performed multiple times daily.

Once data is collected, it may be analyzed in a number of ways. For example, it may be useful to determine the performance of the OPC model using wafer data over time. That is, changes in the process monitoring and control data for wafers produced using a given process are monitored over a selected time period. In particular, OPC gauges that are sensitive to changes in the process are checked against baseline to see if they change. Data regarding the process may change as a result of changes to the equipment on the production lines (different equipment), changes to the design of the target patterns, or other changes over time.

Once changes or errors are observed, a root-cause analysis 820 may be performed. This root-cause analysis should determine, among other things, whether the problems observed are primarily related to the OPC model itself, or other factors.

Once it is determined that the OPC model is an important source of error, a determination may be made regarding corrective action to be taken to adjust the process 830. Adjusting the process should be understood to mean both corrections to process conditions (such as dose, focus, etc.) and changes to the OPC model. In the near term, corrections may be made, for example, to dose or focus conditions in order to improve imaging performance 840. Likewise, the OPC model may undergo adaptive perturbations that constitute less than a complete revision of the model. In the longer term, modifications to the OPC such as retargeting may be implemented 850. In view of the fact that retargeting requires a new reticle to be produced, the control loop for retargeting is typically over longer time periods than modifications to dose or focus, for example.

The model may then be adjusted using the collected monitoring and control data collected in the database. This can determine, for example, whether the cause of the out of specification results are because of a machine that is not performing as predicted. By way of example, if one particular combination of tools is producing poor results, then the production workflow can be adjusted to ensure that the failing combination is not used.

In another example, performance of the model can be checked against scanner flows, track flows, etch flows, or the like. The effects of the model can be separated from other effects based on the historical data for sets of patterns that have been previously collected, analyzed, and compared. Because the OPC model itself does not change, while process and design changes are changed more frequently, it is possible to isolate the effects of the model vs. other sources of error. Root cause analysis algorithms may be applied to isolate the specific sources. If, for example, a scanner performance issue were the cause, this would be apparent from the analysis of the collected data. If, on the other hand, a new design were implemented and out of specification behavior is observed, then the design could be understood to be the source of the observed issue.

Similarly, particular patterns that are out of specification can be identified. That is, if over a large number of wafers or a large number of designs, similar patterns or types of patterns (e.g., contact holes, dense lines, isolated lines, dense trench, isolated trench, H shapes, T shapes, corners at varying angles, single or double scattering bars, etc.) exhibit common errors, then it may be inferred that there is an error in a portion of the modeled behavior of the process.

In this approach, patterns having common errors may be grouped in a number of ways. One is by way of design rules. For a given design, a set of rules may be specified that provide parameters for the design elements in a mask for use in a particular process. These rules specify particular restrictions on, for example, distances between features and feature sizes to allow for variance in production processes while seeking to ensure in-specification results. By looking at design rules, patterns may be grouped for similarity.

In another embodiment, machine learning algorithms may be applied to identify appropriate pattern groups having common errors. The embodiment is not limited to any particular machine learning model. The machine learning model can be for example, a neural network, a convolutional neural network (CNN), a Bayesian network, a generalized linear model, a deep learning model or other available machine learning models. As will be appreciated, the machine learning algorithms may be trained to identify patterns that should be grouped together as exhibiting common errors.

Likewise, various pattern matching algorithms may be applied. Template matching, trained pattern matching, kernel based pattern matching, and others may be used. While it is in theory possible to use strict matching, fuzzy classification may be a preferred approach given that exact patterns are not often reproduced in various parts of an image. Image recognition algorithms may alternately be used.

A particular example of a process in which a particular type of pattern may be out of specification, is one in which serifs fail to properly correct for shortening of line ends. That is, in an OPC model in which serifs are used to correct shortening of line ends in isolated line patterns, and over time, defects in line ends of isolated line patterns are observed, then it may be reasonable to infer that the performance of the serifs have not been properly modeled in the OPC model. This is an especially likely conclusion if the same effect is observed in several different processes or using different production equipment. As will be appreciated, as new patterns are implemented, there will be overlapping features so that, for example, pattern-based sources of error vs process-based sources of error can be isolated.

In the case where a particular pattern shows such a systemic issue, then a pattern-based retargeting 850 may be implemented. That is, for every portion of a design that includes that pattern, a correction is applied. This correction may be, for example, a change in the mask design (e.g., increasing or decreasing the size of a serif or other assist-feature, moving a feature edge by a selected distance, etc.), or may be a change in process (e.g., increasing or decreasing dose or altering the etch process). Even though a new and newly qualified OPC model has not been produced or implemented, the design may take into account the observed behavior of the prior model and the differences between that modeled behavior and the real-world observations. Additionally, for future designs that include the same type of pattern that has previously been determined to produce out of specification results, metrology sites may be selected to ensure that some or all of the patterns of that type are measured.

In an embodiment, the corrections applied to the patterns that are observed to have a common error type are selected to provide local correction while limiting impact on patterns that are not out of specification. That is, where a complete re-design of the OPC model in response to a systemic issue with a particular pattern would involve changing the model with respect to all patterns, instead, the pattern-based retargeting would only affect those specific patterns. OPC corrections for patterns of other types do not need to be recalculated and the corrections added to the selected patterns should have only minimal effects on other types of patterns.

The database may further be used to collect metrology data and verify the validity of the corrections applied. Following on the previous example, once the serifs or other assist-features are modified for the line ends of isolated line patterns, measurements may be taken to verify the effectiveness of the change. Thus, without completely re-building and re-qualifying the OPC model, the updated model is re-qualified as to the specific local changes made. This local qualification may be performed, for example, by measuring one or more relevant image parameters such as CD for the isolated lines that have been subjected to modified OPC features.

In this manner, those regions of the pattern that are already in specification should remain in specification while those regions that are not in specification can be corrected or improved.

Where pattern-based retargeting is used, the database may be used in combination with a pattern database to create metrology site lists to verify the validity of corrections made in retargeting. That is, specific metrology sites are selected that are adapted to observation of the effects of the pattern-based retargeting and measurements at these specific sites are used in verification. In this manner, the updates to the OPC model based on pattern-based retargeting may be qualified for further use in additional pattern design processes.

Thus, one output of the method is an updated retargeting recipe for the OPC model. The updated recipe can then be used to make adjustments in other target images in the future.

In an embodiment, the model may be rebuilt 860 based on the observed deficiencies of the original model. The rebuilding may be performed, for example, in a shadow mode or side path. That is, it is not directly performed and implemented, but rather involves a continuous update of the models without making changes to the manufacturing process, with the updated model being checked against actual performance in an ongoing fashion. In this way, the manufacturing process is not necessarily interrupted while a new OPC model is built and qualified. That is, there are incremental additions to the model rather than fully re-building the model.

In summary, three different time scales may be considered for correction and control. As data is collected and out of specification performance is observed, the production process is adjusted to make corrections. Short term corrections may be applied using changes in process controls (e.g., dose, focus, illumination settings). Medium term changes may be implemented using retargeting. Finally, longer term changes may be implemented by modifying the model and requalifying the updated model.

In an embodiment, obtaining the image comprises measuring a formed pattern on the substrate using an inspection apparatus (such as an apparatus as described with respect to FIG. 3 and/or 4). In an embodiment, the measuring of the formed pattern is guided by the information regarding the spatial bearing. That is an embodiment the pattern is specially measured at regions along the spatial bearing direction corresponding to each of the one or more EPs for which spatial bearing information is provided. For example, as shown in FIG. 7, the location of EP 730 and/or of EP 740 with respect to associated formed pattern can be determined, if necessary, in the coordinate system of the inspection apparatus and then a measurement can be taken within a threshold distance from that location of EP 730 and/or of EP 740 with respect to the formed pattern and along the spatial bearing direction (which can be determined, by, e.g., the inspection apparatus, from the information regarding the locations of EP 730 and EP 740 or which be included with the spatial bearing information). In an embodiment, the guided measurement comprises the inspection apparatus obtaining extra measurement information at the regions of the pattern. In an embodiment, the guided measurement comprises the inspection apparatus obtaining measurement information at the regions of the pattern but not at other locations on the pattern.

At 840, a determination of the location of one or more EPs on the measured pattern image is performed. If necessary, the image is aligned with the coordinate system of the spatial bearing information, e.g., with the GDS, GDSII or OASIS coordinate system, or with a simulated pattern contour (e.g., by a computer image processing technique that can mathematically align the simulated target contour with the generalized shape of the formed pattern in the image), or with the locations of a collection of spatially distributed EPs 730 and/or of EPs 740 (e.g., by a computer image processing technique that can mathematically align the spatially distributed EPs 730 and/or of EPs 740 with the generalized shape of the formed pattern in the image). The alignment can be done using die to database (D2DB) capabilities of an inspection apparatus.

To determine the location of the one or more EPs on the measured pattern image, a spatial bearing direction included in, or derived from, the spatial bearing information is used along with the location of an associated EP on the simulated target contour and/or of an associated EP on the target polygon. In an embodiment, where the spatial bearing information does not include the spatial bearing direction, the spatial bearing direction can be calculated from the location of an EP on the simulated target contour and the location of the associated EP on the target polygon included in the spatial bearing information.

In particular, to determine the location of the one or more EPs on the measured pattern image, the location of the associated EP on the simulated target contour and/or from the associated EP on the target polygon in the image coordinate system is determined or marked and the image is analyzed along the spatial bearing direction from the location of the associated EP on the simulated target contour in the image coordinate system and/or from the associated EP on the target polygon in the image coordinate system to identify where along the spatial bearing direction the boundary of the pattern is intercepted. So, in an embodiment and in the context of FIG. 7, the result is effectively determining the intercept of the imaginary line 750 with the boundary of the measured pattern image 720 to identify the location of EP 760 on the pattern image 720 at that intersection. Of course, a line need not be drawn on an image to accomplish identifying this intercept. Rather, a data processing technique can be applied along the direction 750 from the location of EP 730 in the image coordinate system and/or of EP 740 in the image coordinate system to identify where the boundary of the pattern image 720 is reached. The image data processing technique to identify the boundary can be any present or future technique for this purpose. In an embodiment, a known measurement algorithm (e.g., CD measurement algorithm) and associated threshold can be used as used for, e.g., cutline gauge determination. For example, in an embodiment, the image data processing can evaluate the gradient of the values of the pixel data and identify the boundary where the gradient crosses or meets a certain threshold (e.g., the maximum gradient or within 10% of the maximum). This technique can enable the identification of the boundary as a location somewhere on the up or down slope of the edge of the pattern (e.g., about the middle of the slope or a position on the slope about 10-30% from the bottom).

The embodiments may further be described using the following clauses:

1. A method of controlling an imaging process that uses an optical proximity correction (OPC) model, comprising:
   obtaining an OPC model that is configured to model the behavior of OPC modifications to a pre-OPC design in a process for forming a pattern on a substrate using a post-OPC design in a patterning process;
   using the patterning process in a manufacturing environment;
   collecting process control data in substrates patterned using the patterning process in the manufacturing environment;
   storing the collected process control data in a database;
   analyzing, by a hardware computer system, the stored, collected process control data to verify that the OPC model is correcting pattern features within a selected threshold; and for pattern features falling outside the selected threshold, determining a modification to the imaging process to correct imaging errors.
2. A method as in clause 1, wherein the modifications are selected to correct the patterning process such that imaged features on the substrate are accurate within selected limits.
3. The method of clause 1, wherein the patterning process is a photolithographic process.
4. The method of clause 1, wherein the analyzing includes application of a root cause analysis to the stored, collected process control data.
5. The method of clause 1, wherein the modification comprises adjusting a process parameter of the photolithographic patterning process.
6. The method of clause 5, wherein the parameter is one or more parameters selected from the group consisting of: dose, focus, and illumination setting.
7. The method of clause 1, wherein the modification comprises retargeting the optical proximity modifications.
8. The method of clause 1, wherein the modification comprises rebuilding the OPC model and qualifying the rebuilt OPC model.
9. The method of clause 1, wherein the modification comprises adaptively perturbing the OPC model.
10. The method of any of the foregoing clauses, wherein analyzing includes: determining common errors among members of one of a plurality of types of patterns of the post-OPC design;
    grouping patterns that exhibit the common errors into at least one group of patterns; and
    determining the modification to the imaging process to be a modification limited to patterns comprising the at least one group of patterns.
11. The method of clause 10, wherein the grouping patterns comprises using a machine learning algorithm.
12. The method of clause 10, wherein the grouping patterns comprises using a pattern matching algorithm.
13. The method of clause 12, wherein the pattern matching algorithm comprises a fuzzy pattern matching algorithm.
14. The method of clause 10, wherein the grouping patterns comprises using design rule analysis.
15. The method of clause 1, wherein at least some metrology sites are selected to include patterns determined to include features of the same type as the features not within the selected threshold.
16. The method of clause 15, wherein the features of the same type are selected using a pattern matching algorithm.
17. The method of clause 1, wherein the process control data is selected from the group consisting of: CD control data, OPC calibration data, OPC monitoring and hotspot CD data, defect data, dose settings, focus settings, illumination settings, metrology data, SEM data, and system internal sensor data.
18. The method of clause 1, wherein the OPC model obtained is a qualified OPC model.
19. A method of manufacturing devices wherein a device pattern is applied to a series of substrates using a patterning process, the method including controlling an imaging process in accordance with the method of clauses 1-18.
20. A non-transitory computer program product comprising machine-readable instructions configured to cause a processor to cause performance of the method of any of clauses 1-19.
21. A system for controlling an imaging process that uses an optical proximity correction (OPC) model, comprising:
    a database, in communication with a plurality of photolithographic patterning apparatuses and configured to:
    collect process control data from substrates patterned in a manufacturing environment using a photolithographic patterning process that uses a post-OPC design in accordance with an OPC model that is configured to model the behavior of OPC modifications to a pre-OPC design; and
    store the collected process control data in the database; a hardware computer system in communication with the database and configured to:
    analyze the stored, collected process control data to verify that the OPC model is correcting pattern features within a selected threshold; and
    for pattern features falling outside the selected threshold, to determine a modification to the imaging process to correct imaging errors.

An embodiment may include a computer program containing one or more sequences of machine-readable instructions that enable practice of a method as described herein. This computer program may be included, for example, with or within the apparatus of any of FIGS. 1-4. There may also be provided a data storage medium (e.g., semiconductor memory, magnetic or optical disk) having such a computer program stored therein. Where an existing apparatus, for example of the type shown in any FIGS. 1-4, is already in production and/or in use, an embodiment can be implemented by the provision of updated computer program products for causing a processor of the apparatus to perform a method as described herein.

An embodiment of the invention may take the form of a computer program containing one or more sequences of machine-readable instructions to cause execution of a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example proximity correction may also be used in mask writing using electron beam technology, and the foregoing may be applied in a method parallel to the application to optical imaging methods.

Although specific reference may be made in this text to the manufacture of ICs, it should be understood that the description herein has many other possible applications. For example, it may be employed in the manufacture of integrated optical systems, guidance and detection patterns for magnetic domain memories, flat-panel displays, micro-electro mechanical systems (MEMS), liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Unless specifically noted otherwise, the terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

It is noted that the terms "mask", "reticle", "patterning device" are utilized interchangeably herein. Also, a person skilled in the art will recognize that, especially in the context of lithography simulation/optimization, the term "mask"/"patterning device" and "design layout" can be used interchangeably, as in lithography simulation/optimization, that a physical patterning device is not necessarily used but a design layout can be used to represent a physical patterning device.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

In an optimization process of a system or process, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system or process can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image or pattern on a substrate, as well as non-physical characteristics such as dose and focus.

The term "optimizing" and "optimization" as used herein refers to or means adjusting a patterning process apparatus, one or more steps of a patterning process, etc. such that results and/or processes of patterning have more desirable characteristics, such as higher accuracy of transfer of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method of controlling an imaging process that uses an optical proximity correction (OPC) model, the method comprising:
   obtaining an already-calibrated OPC model that is configured to model behavior of OPC modifications to a pre-OPC design in a process for forming a pattern on a substrate using a post-OPC design in a patterning process;
   using the patterning process in a manufacturing environment;
   collecting process control data for substrates patterned using the patterning process in the manufacturing environment;
   analyzing, by a hardware computer system, the collected process control data to verify that the OPC model is correcting pattern features within a selected threshold; and
   for pattern features falling outside the selected threshold, determining a modification to the imaging process to correct imaging errors.

2. The method as in claim 1, wherein the modification is selected to correct the patterning process such that imaged features are accurate within selected limits.

3. The method of claim 1, wherein the patterning process is a photolithographic process.

4. The method of claim 1, wherein the analyzing includes application of a root cause analysis to the collected process control data.

5. The method of claim 1, wherein the modification comprises adjusting a process parameter of the patterning process.

6. The method of claim 5, wherein the parameter is one or more parameters selected from the group consisting of: dose, focus, and illumination setting.

7. The method of claim 1, wherein the modification comprises retargeting the OPC modifications.

8. The method of claim 1, wherein the modification comprises rebuilding the OPC model and qualifying the rebuilt OPC model.

9. The method of claim 1, wherein the modification comprises adaptively perturbing the OPC model.

10. The method of claim 1, wherein the analyzing includes:
    determining common errors among members of one of a plurality of types of patterns of the post-OPC design, and
    grouping patterns that exhibit the common errors into at least one group of patterns; and
    wherein the determining includes determining the modification to the imaging process to be a modification limited to patterns comprising the at least one group of patterns.

11. The method of claim 10, wherein the grouping of patterns comprises using a machine learning algorithm.

12. The method of claim 10, wherein the grouping of patterns comprises using a pattern matching algorithm.

13. The method of claim 12, wherein the pattern matching algorithm comprises a fuzzy pattern matching algorithm.

14. The method of claim 10, wherein the grouping of patterns comprises using design rule analysis.

15. The method of claim 1, wherein at least some metrology sites are selected to include patterns determined to include features of the same type as the features not within the selected threshold.

16. A computer program product comprising a non-transitory computer-readable medium having computer readable instructions therein, the instructions, upon execution by a computer system, configured to cause the computer system to at least:
    obtain an already-calibrated optical proximity correction (OPC) model that is configured to model behavior of OPC modifications to a pre-OPC design in a process for forming a pattern on a substrate using a post-OPC design in a patterning process;
    collect process control data for substrates patterned using the patterning process in the manufacturing environment;
    analyze the collected process control data to verify that the OPC model is correcting pattern features within a selected threshold; and
    for pattern features falling outside the selected threshold, determine a modification to an imaging process that uses the optical proximity correction (OPC) model, to correct imaging errors.

17. The computer program product of claim 16, wherein the modification comprises a retargeting of the OPC modifications.

18. The computer program product of claim 16, wherein the modification comprises rebuilding of the OPC model and qualification of the rebuilt OPC model.

19. The computer program product of claim 16, wherein the modification comprises an adaptive perturbation of the OPC model.

20. The computer program product of claim 16, wherein the instructions configured to cause to computer system to analyze the collected process control data are further configured to cause the computer system to:
    determine common errors among members of one of a plurality of types of patterns of the post-OPC design, and
    group patterns that exhibit the common errors into at least one group of patterns; and
    wherein the instructions configured to cause to computer system to determine the modification are further configured to cause the computer system to determine the modification to the imaging process to be a modification limited to patterns comprising the at least one group of patterns.

* * * * *